United States Patent [19]

LaMarche et al.

[11] 4,028,496
[45] June 7, 1977

[54] DIGITAL SPEECH DETECTOR

[75] Inventors: Robert Ernest LaMarche, Atlantic Highlands; Carl Jerome May, Jr., Holmdel; Timothy James Zebo, Freehold, all of N.J.

[73] Assignee: Bell Telephone Laboratories, Incorporated, Murray Hill, N.J.

[22] Filed: Aug. 17, 1976

[21] Appl. No.: 715,121

[52] U.S. Cl. .......................................... 179/15 AS
[51] Int. Cl.² .......................................... H04J 6/00
[58] Field of Search ........... 179/15 AS, 1 VC, 1 SC

[56] References Cited

UNITED STATES PATENTS

| | | | |
|---|---|---|---|
| 3,520,999 | 7/1970 | May | 179/15 AS |
| 3,644,680 | 2/1972 | Amano | 179/15 AS |
| 3,649,766 | 3/1972 | LaMarche | 179/15 AS |
| 3,712,959 | 1/1973 | Fariello | 179/1 VC |
| 3,801,747 | 4/1974 | Queffeulou | 179/15 AS |
| 3,832,493 | 8/1974 | Clark | 179/15 AS |

OTHER PUBLICATIONS

E. Lyghounis, et al., "Speech Interpolation in Digital Transmission Systems", IEEE Trans., v.COM-22, No. 9, Sept. 1974, p. 1179ff.
J. A. Jankowski, Jr., "A new digital voice-activated switch", Comsat Technical Review vol. 6, No. 1, Spring 1976, p. 159ff.
A. M. Molinari et al., "Bit Rate Per Channel Halving in PCM Multiplexes . . .", Zurich Seminar on Digital Comm., 1976, pp. A7.1–A7.8.

Primary Examiner—Kathleen H. Claffy
Assistant Examiner—Kenneth A. Chayt
Attorney, Agent, or Firm—D. E. Snedeker

[57] ABSTRACT

The detection sensitivity and noise rejection of an arrangement for detecting speech in the presence of noise is improved by accumulating the weighted differences between input signal samples and their short-term running average. The detector thus tracks ambient noise, providing an adaptive detection threshold such that detection sensitivity is increased in low noise environments without excessive false operation on high level noise. The peak average attained during an interval of speech is used to provide variable hangover upon cessation of speech, yielding greater hangover for weak talkers than for loud talkers. In an illustrative embodiment of the speech detector used in a speech interpolation system, protection is afforded also against false transmission path operation due to detection of speech echo.

17 Claims, 5 Drawing Figures

| INPUT SIGNAL | COMPARATOR THRESHOLD | WEIGHT |
|---|---|---|
| PROBABLY NOISE | FB<2EMP | -1 |
| PROBABLY SPEECH | 2EMP≦FB<4EMP | +4 |
| NOT NOISE | FB≧4EMP | +20 |
| STEADY SIGNAL | EMP≧20 | +20 |

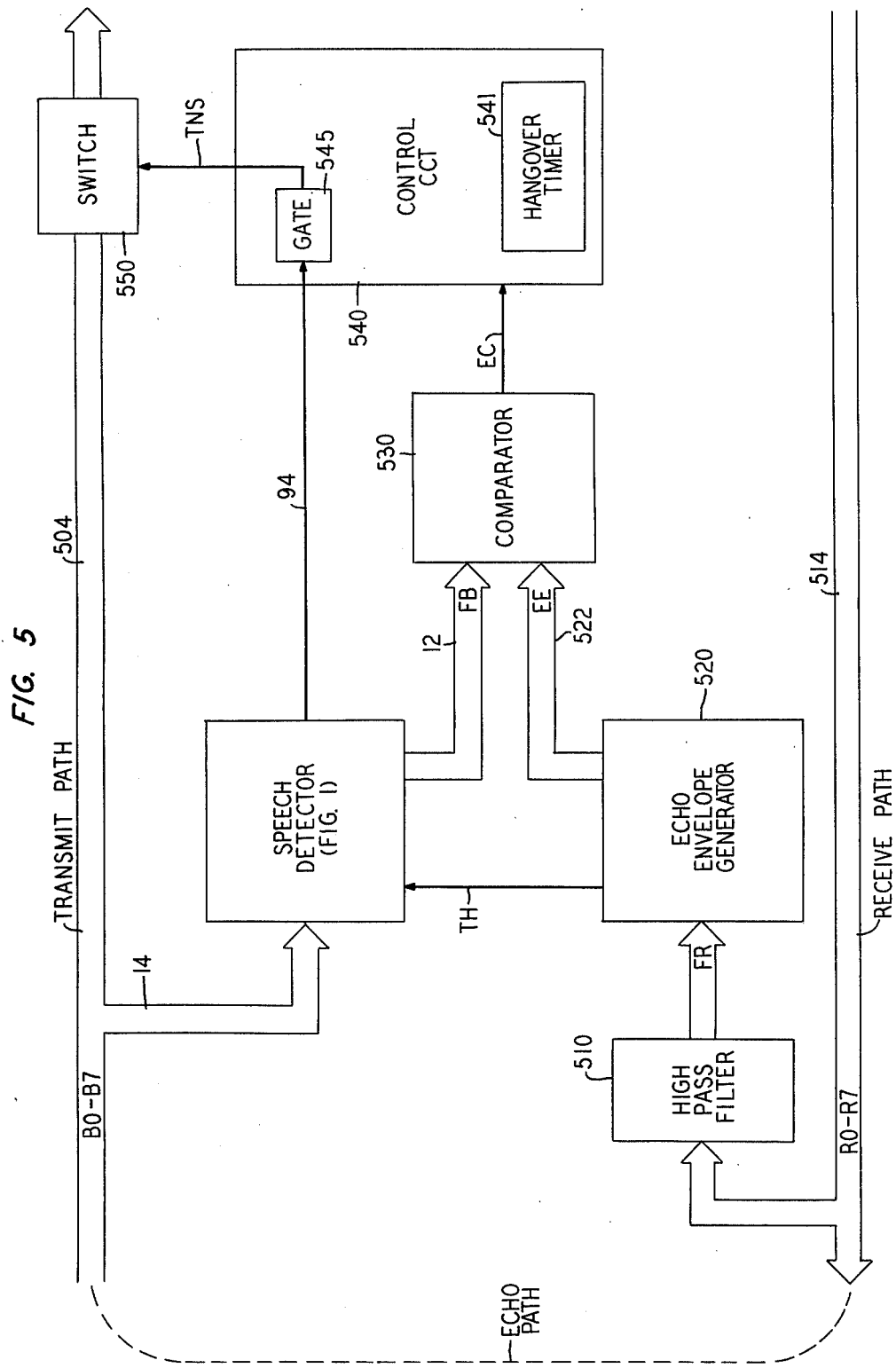

DIGITAL SPEECH DETECTOR

BACKGROUND OF THE INVENTION

This invention relates to signal detecting arrangements and, more particularly, to methods and arrangements for detecting speech activity in the presence of noise.

Speech detection arrangements are useful in a variety of speech transmission systems in which speech transmission paths are established in response to the detection of speech activity, such as for speech interpolation or echo suppression break-in purposes. Ideally, a speech detector should be highly sensitive to the presence of speech signals while at the same time remaining insensitive to non-speech signals, which typically include various types of noise present in the transmission system environment. The difficulty has been in distinguishing quickly and accurately between speech, particularly low level speech, and certain of the noise signals. Consequently, known methods and arrangements for detecting speech have generally suffered from such limitations as undesirable speech clipping on the one hand and excessive system activity due to noise sensitivity on the other hand.

SUMMARY OF THE INVENTION

A primary object of the present invention, therefore, is to provide an improved method and arrangement for detecting speech activity in the presence of noise.

In an illustrative embodiment of a speech detector according to our invention, detection sensitivity and noise rejection are improved by accumulating the weighted magnitude differences between incoming signal samples and their short-term running average. The detector thus tracks ambient noise and provides an adaptive detection threshold such that detection sensitivity is increased in low noise environments without excessive false operation on high level noise. The difference weighting and detection threshold levels may be selected advantageously so as to provide improved detection sensitivity and noise immunity while permitting a relatively simple and inexpensive circuit implementation. Further, sensitivity to d.c. and low frequency noise may be reduced readily by provision of a highpass input filter.

According to another aspect of the invention, the peak average magnitude attained during an interval of speech is used to provide variable hangover upon cessation of speech activity, yielding greater hangover for weak talkers than for loud talkers, illustratively in an inversely proportional relationship. A fixed minimum hangover is provided so as to reduce clipping at the onset of weak speech activity such as that beginning with short duration consonants.

BRIEF DESCRIPTION OF THE DRAWING

The above and other objects and features of the invention may be fully apprehended from the following detailed description and the accompanying drawing in which:

FIG. 5 is a block diagram of an illustrative embodiment of a typical speech interpolation system employing a speech detector according to the invention.

DETAILED DESCRIPTION

Figure 1:
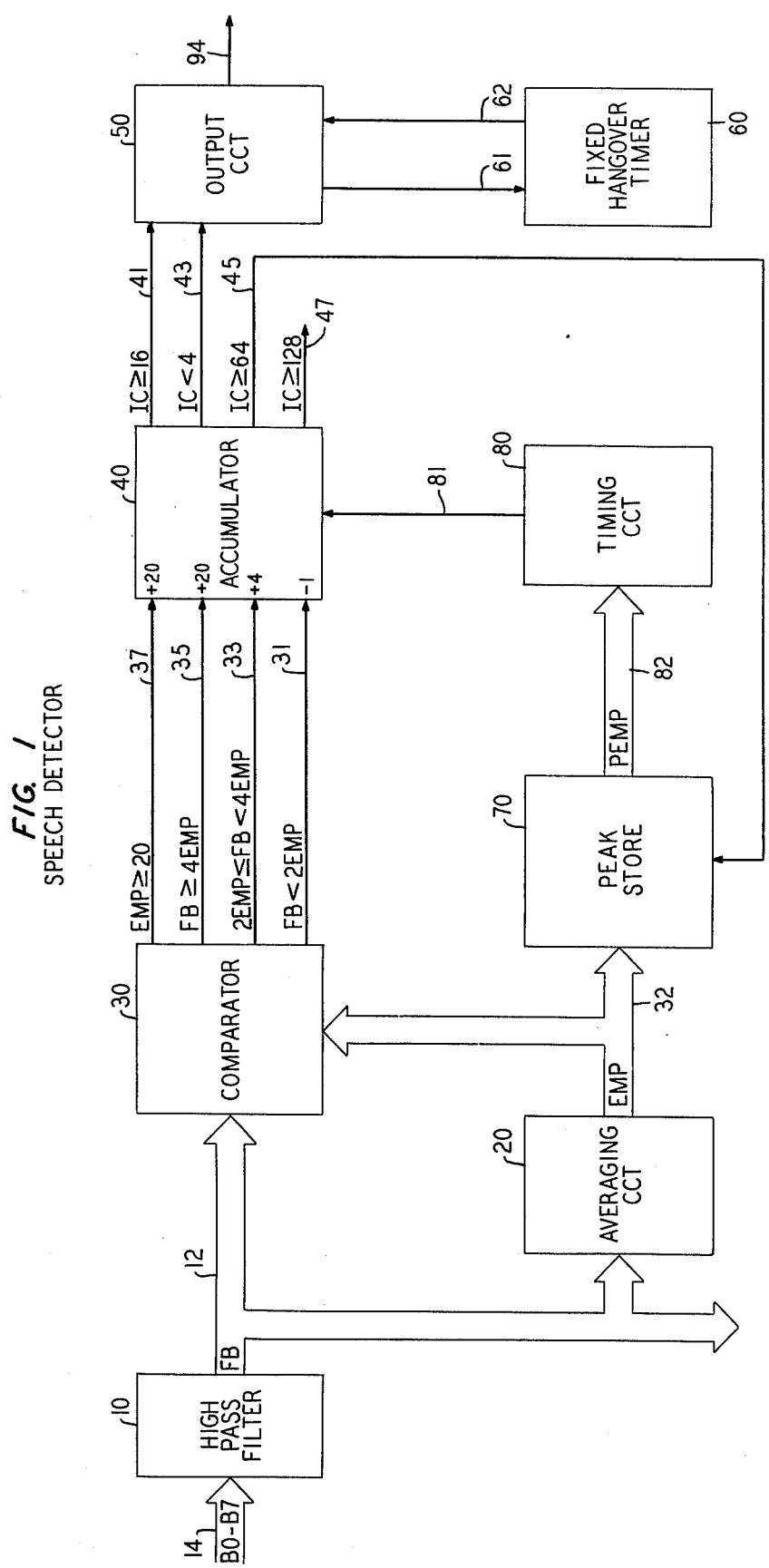
FIG. 1 is a functional block diagram of an illustrative speech detector embodiment in accordance with the invention.

For purposes of describing the illustrative speech detector embodiment shown in FIG. 1, input speech signal samples are assumed to comprise 8bit digital code words. One such code in common use is a companded sign magnitude code used in pulse code modulation speech transmission systems. Each 8-bit companded sign magnitude code word would include a sign bit B7, three segment or chord bits B4–B6, and four linear or position bits B0–B3. Sign bit B7 thus indicates the polarity of the encoded signal and bits B0–B6 indicate the magnitude thereof, bits B0–B7 being extended in parallel over input path 14 to the speech detector.

As mentioned above, the usual function of a speech detector is to define the time intervals during which, for example, a speech transmission path is to be established. Thus, the illustrative speech detector in FIG. 1 operates to determine the presence of encoded speech signals on input path 14 and to provide a coresponding speech activity indication on output lead 94. Briefly, in accordance with our invention, the individual encoded speech signal samples on the input path are compared by comparator 30 with the short-term running average of the signal samples as determined by averaging circuit 20. The differences therebetween are quantized and weighted, and the weighted diferences are accumulated in accumulator 40, which may comprise a conventional digital integrator circuit. When a predetermined threshold is reached by accumulator 40, output circuit 50 is enabled to provide the speech activity indication on lead 94.

The indication on lead 94 persists for the duration of speech activity detected on input path 14 and persists thereafter for an interval of time following cessation of such speech activity, typically referred to as a hangover interval. The hangover interval of the speech detector embodiment in FIG. 1, according to one aspect of the invention, comprises both a fixed interval of time and a variable interval of time. The fixed hangover interval, determined principally by timer 60, functions primarily to reduce clipping at the onset of weak speech activity. The variable hangover interval, determined principally by peak store 70, timing circuit 80 and accumulator 40, serves to provide greater hangover for weak talkers than for loud talkers.

In a typical speech transmission system environment, the signals appearing on path 14 also include non-speech or noise signals to which the speech detector should remain substantially insensitive. The noise signals may include Gaussian or thermal noise, impulse noise and 60 hertz power line induction noise, as well as d.c. offset in systems where analog-to-digital conversion is involved. Detector sensitivity to d.c. and low frequency noise is reduced advantageously at the input of the speech detector by highpass filter 10, which may comprise a first order digital filter of conventional design. Filter 10 effectively attenuates the d.c. and 60 hertz noise components on input path 14; but filter 10 has little effect on Gaussian, impulse or other noise components, which are thus extended therethrough over path 12 in the same manner as speech signals to averaging circuit 20 and comparator 30. Since the polarity of the filtered signals is not required for speech detection purposes, only the seven magnitude bits of each need be extended over path 12.

Averaging circuit 20 generates a short-term running average of the filtered 7-bit encoded signal samples FB appearing on path 12. Thus, averaging circuit 20 essentially provides a running measure of the input power and may be thought of as a lowpass filter having a short time constant, illustratively on the order of 16 milliseconds.

A variety of known arrangements may be employed for determining the running average magnitude of the input signal samples. As depicted illustratively in FIG. 2, averaging circuit 20 comprises a pair of adders 22 and 26 and a 14-bit store 24 for generating what may be referred to as the exponentially-mapped-past (EMP) of the preceding sequence of signal samples on path 12, that is, the signal samples over the preceding approximately 16 milliseconds. EMP averaging is particularly useful in control or detection situations where interest is directed at the recent past behavior of a process and is described in detail, for example, in the *IRE Transactions on Automatic Control, Vol. AC-5* (January 1960), pages 11–17. The EMP average of a sequence of values or samples is determined by weighting recent samples more heavily than less recent samples, the relative weighting being a geometric ratio for example.

The operation of averaging circuit 20 is such that store 24 holds a 14-bit magnitude, the most significant 7 bits of which, bits EMP (7—13), are interpreted as the integer part of the EMP average, which is provided by circuit 20 on path 32. the least significant 7 bits in store 24, bits EMP (0–6), are interpreted as the fractional part of the current EMP. The 14-bit EMP in store 24 is added, via adder 26, to the inverted value of the 7-bit integer part thereof, yielding a SUM effectively corresponding to the current EMP minus the product of $2^{-7}$ times the current EMP. This SUM is, in turn, added to the next filtered signal sample FB on path 12, via adder 22, to yield a new 14-bit EMP for storage in store 24. The most significant bit MSB of adder 22 is combined with the carry-out bit COB in OR gate 23 to provide overflow protection.

Figures 2, 4:
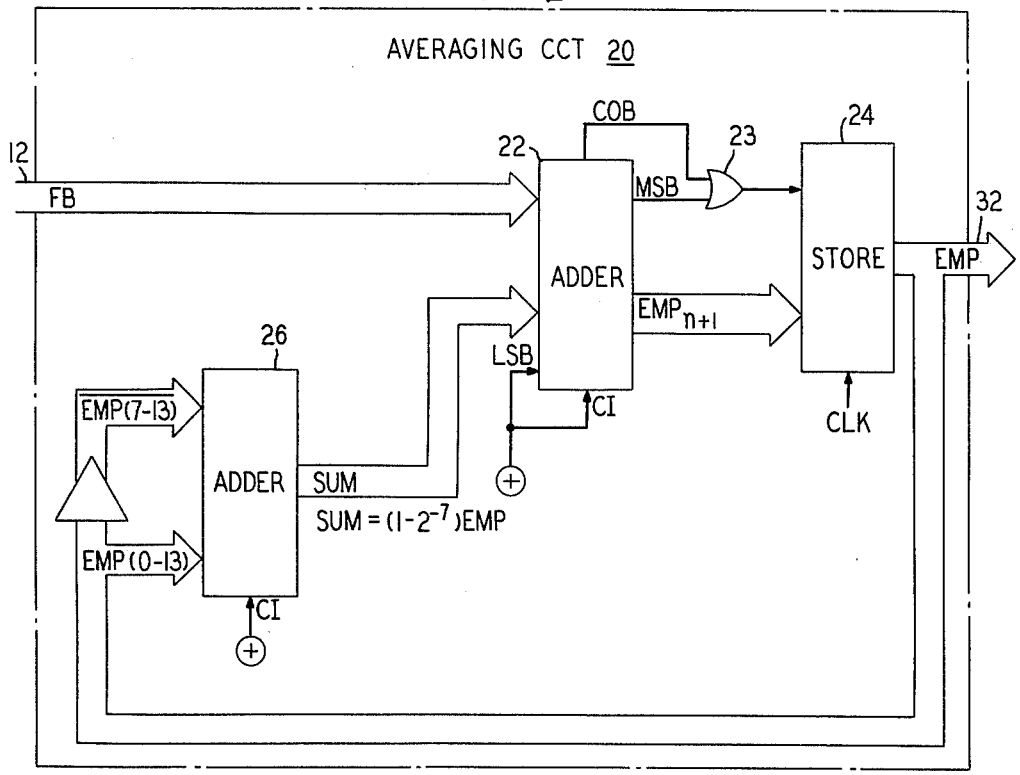
FIG. 2 shows an illustrative averaging circuit for the speech detector of FIG. 1.
FIG. 4 is a table showing various input signals that may occur and corresponding comparator thresholds and weights that may be employed in the speech detector of FIG. 1.

If desired, as shown in FIG. 2, the EMP value registered in store 24 can be modified slightly to achieve a particular relationship between the EMP and the anticipated magnitude of noise signals on path 12. For example, we have found that false operation or noise may be reduced further in the illustrative speech detector embodiment by predetermining the values of the least significant bit and the carry-in lead of adder 22 and of the carry-in lead of adder 26 to be binary 1. Alternatively, of course, the particular relationship can be achieved by modifying the value of the filtered samples FB.

The EMP average in store 24 (i.e., the 7-bit integer value) is extended over path 32 to comparator 30 for comparison with the 7-bit filtered input signal samples FB on path 12. the EMP is used to provide one or more adaptive thresholds against which to measure the signal samples such that detection sensitivity is increased in low noise environments without excessive operation on high level noise. Illustratively, two thresholds are used so as to quantize all possible input signal magnitudes into three ranges, as depicted in FIG. 4. These three ranges of input signal magnitude may be defined conveniently as "probably noise" if the lower threshold is not exceeded, "not noise" if the higher threshold is exceeded, and "probably speech" if the signal falls between the two thresholds. The higher threshold is thus selected to be greater than any anticipated single sample noise magnitude, such as approximately four times the EMP. The lower threshold is selected such that it may be exceeded occasionally by high level noise samples but the probability of this occurring in successive or proximate samples is very low. We have found a suitable lower threshold to be approximately two times the EMP.

If the input signal sample FB on path 12 exceeds four times the EMP on path 32, therefore, a not noise indication is provided by comparator 30 over lead 35 to accumulator 40. If the input signal sample FB does not exceed 4 EMP but does exceed two times the EMP, a probably speech indication is provided over lead 33 to accumulator 40. If neither threshold is exceeded, a probably noise indication is provided over lead 31 to accumulator 40.

Comparator 30 may also compare the EMP on path 32 with a fixed threshold level, illustratively 20 (i.e., binary 0010100); and if the fixed threshold is exceeded by the EMP, regardless of the relative magnitude of the input signal, a "steady signal" indication is provided on lead 37 to accumulator 40. The fixed threshold level is selected to be greater than the highest magnitude noise signal anticipated and may be employed, for example, to detect steady tone signals.

The signals on leads 31, 33, 35 and 37, that is, the results of comparisons between the successive input signal samples FB and the EMP average, are weighted and accumulated in accumulator 40. Responsive thereto, accumulator 40 makes the basic decision of whether speech (or tone) is present on input path 14. In particular, if the level accumulated in accumulator 40 reaches a predetermined active threshold, illustratively a count of 16, an active signal is provided over lead 41 to output circuit 50. Responsive thereto, output circuit 50 provides a speech activity indication on output lead 94. Subsequently, if the level in accumulator 40 falls below a certain inactive threshold, advantageously lower than the active threshold and illustratively a count of 4, an inactive signal is provided over lead 43 to output circuit 50.

The accumulator thresholds and the weights assigned to the comparator indications on leads 31, 33, 35 and 37 are chosen such that: (1) a single signal sampel FB providing a not noise indication on lead 35 will cause accumulator 40 to reach or exceed its active threshold; (2) some minimum number of samples FB providing probably speech indications on lead 33, illustratively at least four such samples, are required to cumulatively increment accumulator 40 to its active threshold; (3) probably noise indications on lead 31 slowly decrement the accumulator count toward zero; and (4) a single steady signal indication on lead 37 causes accumulator 40 to each or exceed its active threshold. Thus, as depicted in FIGS. 1 and 4, comparator 30 indications on leads 31, 33, 35 and 37 are assumed to be assigned the respective weights of −1, +4, +20 and +20.

Accumulator 40 has a total range or count capacity substantially exceeding its active threshold of 16, the range above 16 being used in conjunction with peak store 70 and timing circuit 80 to provide variable hangover. For this purpose, as described in detail below, an accumulator noise threshold can be defined which impulse noise will rarely exceed, illustratively a count of 64. Also, for purposes described below, an accumulator speech threshold can be defined which even a very weak talker will usually exceed, illustratively a count of 128. The total count capacity of accumulator 40 is assumed, for purposes of describing the invention, to be 255.

Figure 3:
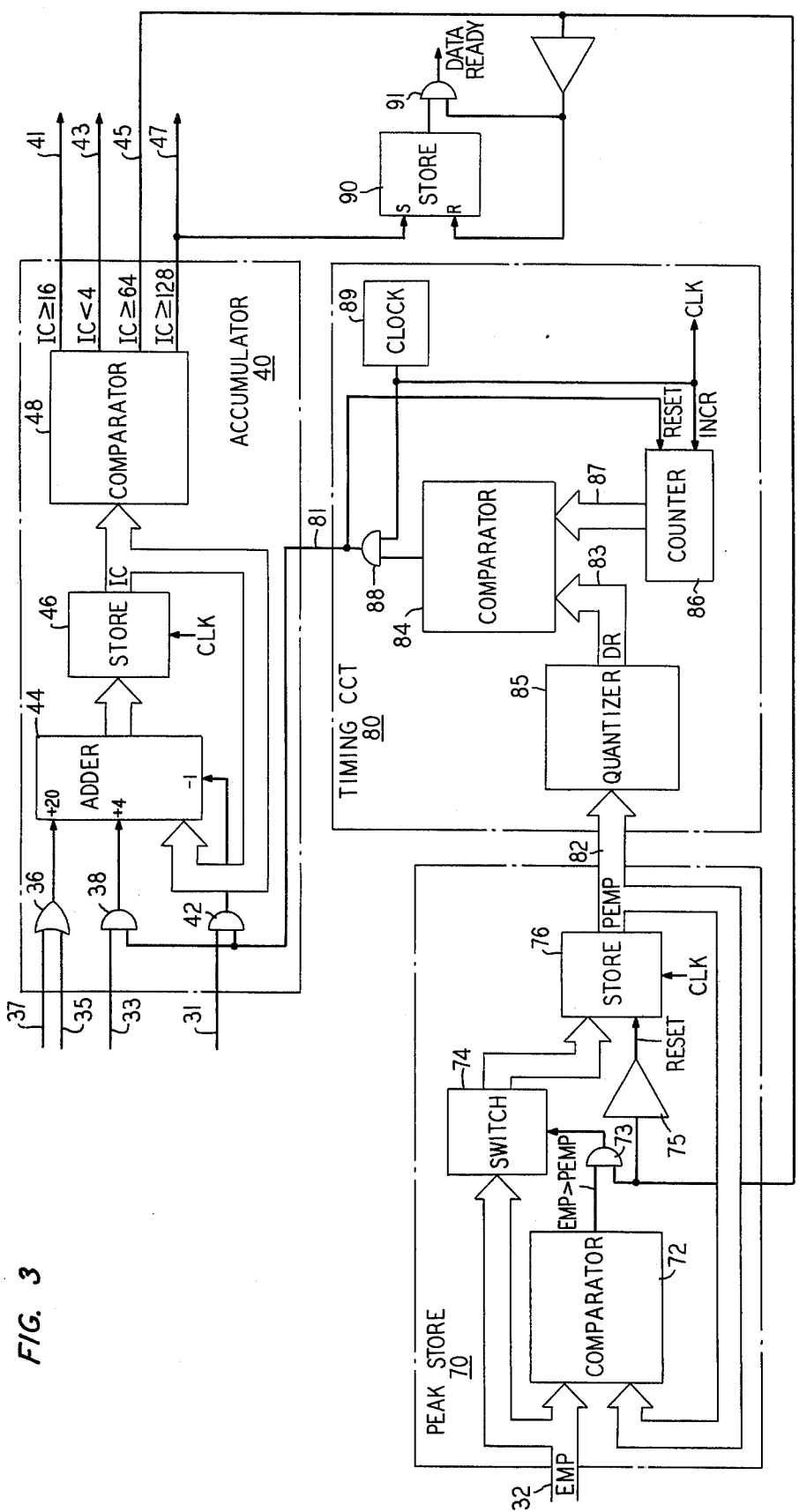
FIG. 3 shows an illustrative peak average store and integrator circuit that may be employed in the speech detector of FIG. 1.

As depicted illustratively in FIG. 3, accumulator 40 comprises adder 44, store 46 and comparator 48. Successive comparator indications on leads 35 and 37 are extended through OR gate 36, functioning in an obvious manner via adder 44 to increment (by +20) the accumulator count IC registered in store 46. Similarly, comparator indications on leads 31 and 33 are extended through gates 42 and 38, respectively, enabled by timing signals on lead 81 in the manner described below, to increment (by +4) or to decrement (by −1) count IC via adder 44. During a typical interval of speech, for example, each successive speech sample on path 14 generates a not noise indication on lead 35, each time incrementing store 46 by a count of 20. The first such sample causes accumulator 40 to reach its active threshold, as determined by comparator 48, providing a signal over lead 41 to output circuit 50. Output circuit 50, in turn, generates the speech activity indication on output lead 94.

Four successive speech samples generating not noise indications on lead 35 will cause accumulator 40 to exceed its noise threshold (i.e., 64), providing a signal on lead 45 to peak average store 70; seven such speech samples cause accumulator 40 to exceed its speech threshold of 128; and 13 samples cause accumulator 40 to reach its capacity count. Obviously, if very low level samples or momentary pauses occur during an interval of speech before accumulator 40 has reached its capacity count, the resulting indications on leads 33 or 31 will increment (+4) or decrement (−1) the accumulator count accordingly, and more than 13 samples may be required to reach the capacity count. Similarly, if the signals on path 12 fall below 2 EMP (and also do not exceed the fixed threshold), either before or after accumulator 40 reaches its capacity count, the resulting indications on lead 31 decrement accumulator 40 back toward zero, as described in greater detail below.

Assuming the speech signals persist on path 12, when accumulator 40 reaches or exceeds its noise threshold of 64, the resulting signal over lead 45 causes peak store 70 to catch and hold the peak EMP average (PEMP) attained during the current interval of speech. The PEMP is an approximation of the talker level or input power attained during the interval of speech, and is used in accordance with our invention to provide variable hangover in an inversely proportional relationship to the talker level. Peak store 70 illustratively comprises comparator 72, switch 74 and store 76. Whenever the PEMP level registered in store 76 is exceeded by the EMP level on path 32, comparator 72 provides a signal to switch 74 through gate 73 (enabled by the signal on lead 45), operating switch 74 to extend the EMP value therethrough as a new PEMP value to be registered in store 76. The PEMP value registered in store 76 during the current interval of speech is extended over path 82 to timing circuit 80. Store 76, and thus peak average store 70, is cleared when accumulator count IC falls below the accumulator noise threshold, via a reset signal through inverter 75 termination of the signal on lead 45.

Timing circuit 80, responsive to the PEMP value extended over path 82, varies the rate of the timing signals on lead 81. The timing signals on lead 81 control the rate at which accumulator 40 is incremented or decremented by the indications on leads 31 and 33. Thus, once accumulator 40 reaches its noise threshold (64), the greater the PEMP value attained during the interval of speech, the faster the decrementing rate upon cessation of speech. The incrementing rate for indications on lead 33 is maintained the same as the decrementing rate for indications on lead 31, via the timing signals, so as to reduce the likelihood that noise signals will cause accumulator 40 to reach its capacity count or will prevent accumulator 40 from being decremented below its inactive threshold.

Although the timing signal rate may be continuously adaptive in response to the PEMP values, in the illustrative embodiment of FIG. 3, the PEMP value on path 82 is quantized via quantizer 85 to provide a plurality of PEMP value ranges and, in turn, a plurality of timing signal rates. Assume, for example, that the PEMP value is quantized into one of 12 ranges or steps, as indicated by a 4-bit word DR directed over path 83 to comparator 84. Assume, further, that in the absence of a PEMP value stored in store 70, the timing signals on lead 81 are provided at the speech sampling rate by clock 89. For example, a typical sampling rate would be 8000 pulses per second, providing a clock pulse on lead CLK every ⅛ millisecond. Thus, the timing signals provided on lead 81 by timing circuit 80 for the various PEMP values may be simply submultiples of the sampling rate, ranging from every ⅛ millisecond when the quantized value DR is zero (that is, for the range of highest PEMP values anticipated for a loud talker) up to every 1½ milliseconds when DR is a maximum (that is, for the lowest range of PEMP values anticipated due to a weak talker).

Counter 86 in timing circuit 80 is incremented by the successive clock pulses on lead CLK from clock 89 and is reset by comparator 84 each time a match is obtained between the value DR on path 83 and the ouput of counter 86 on path 87. When the PEMP value on path 82 is zero (i.e., when integrator count IC is less than 64) the quantized value DR on path 83 corresponds to the reset output of counter 86 on path 87. Consequently, gate 88 is enabled by the output of comparator 84, extending the clock pulses on lead CLK therethrough as timing signals over lead 81 to accumulator 40. If the input sample on path 14 concurrently generates a probably noise indication on lead 31, gate 42 is enabled thereby to extend the timing signal on lead 81 to adder 44, decrementing the count in accumulator 40.

When the accumulator count reaches 64, registering the PEMP value in peak store 70 in the manner just described, a corresponding quantized value DR appears on path 83. Counter 86 is incremented from its reset value via the successive clock pulses until the count therein matches value DR. Comparator 84 provides an indication of the match, enabling gate 88 to extend the next clock pulse there through as a timing signal on lead 81, incrementing or decrementing accumulator 40 if a probably speech or probably noise indication is present on lead 33 or lead 31, respectively, and resetting counter 86. If an indication is not present on lead 33 or lead 31, such as when a not noise indication appears on lead 35, the timing signal on lead 81 is ignored by accumulator 40 and simply resets counter 86.

For purposes of illustration, assume that speech has ceased and that the PEMP value attained during the particular interval of speech was such that the corresponding quantized value DR is 3, i.e., binary 0011. Three successive clock pulses are required to increment counter 86 before a match is indicated by comparator 84, enabling gate 88 to pass the fourth clock pulse therethrough on lead 81. Counter 86 is reset thereby and the cycle repeats, extending every fourth clock pulse through gate 88 as a timing signal on lead 81 to accumulator 40. Thus, in the illustrative example, assuming successive probably noise indications on lead 31, accumulator 40 is decremented once every ½ millisecond until the count therein reaches 64, and thereafter once every ⅛ millisecond until the count reaches zero, approximately 104 milliseconds following cessation of speech if accumulator 40 has reached its maximum count.

In addition to the variable hangover interval provided in accordance with the PEMP value attained during speech, a fixed hangover interval is provided by timer 60, which may comprise a conventional digital timing arrangement. Whenever accumulator count IC falls below a certain inactive threshold, illustratively 4, an inactive signal is extended over lead 43 to output circuit 50. Responsive thereto, output circuit 50 enables timer 60 via lead 61 to initiate a fixed hangover timing interval, which may illustratively be on the order of 16 milliseconds. Upon termination of the fixed hangover timing interval, timer 60 extends a timeout signal to output circuit 50 over lead 62, causing termination of the speech activity indication on output lead 94.

In certain speech detector applications it may be desirable to provide some measure of the speech detector integrity, or of such system characteristics as the transmission loss or gain, or of the talker volume. The present speech detector is particularly suited to these applications since both a running average value EMP and a peak average value PEMP are available to external measuring equipment for each speech interval. Further, as mentioned above, an accumulator speech threshold has been defined which even a weak talker will usually exceed and which can thus be used to provide an indication of the occurrence of an interval of significant speech energy. This indication, appearing on lead 47 in the illustrative embodiment can be used to provide a data ready signal to the external equipment, such as by setting data ready store 90, which may then be reset bia lead 45 upon accumulator 40 falling below its noise threshold. Thus, a data ready signal is provided through gate 91 each time the accumulator count falls below the accumulator noise threshold after having exceeded the accumulator speech threshold. An arrangement using such a data ready signal, along with the EMP value, to estimate the background noise level on path 14 is disclosed in D.G. Messerschmitt-T.J. Zebo patent application, Ser. No. 715,122 filed concurrently herewith.

A particular form of noise called echo may present problems in some speech detector applications, such as in a digital speech interpolation system. It will be apparent that echos on one path (e.g., the transmit path) produced by speech on another path (e.g., the receive path) could be detected as speech to be transmitted over the one path, and thus cause false transmission path operation. Consequently, some form of echo protection must be provided to reduce false speech detector operation arising from the presence of echos. As depicted in FIG. 5, echo protection can be provided simply and advantageously with a speech detector according to our invention using the filtered input signals FB on path 12 and the previously-described speech activity indication on lead 94.

Incoming 8-bit (RO-R7) encoded signals on receive path 514 are filtered via highpass filter 510, which may be substantially similar to highpass filter 10, and the 7-bit filtered magnitude signals FR are extended to echo envelope generator 520. In conventional manner, such as described in A.A. Geigel-R.E. LaMarche patent application, Ser. No. 639,348, filed Dec. 10, 1975, generator 520 generates an encoded approximation EE on path 522 of the echo anticipated on transmit path 504 due to incoming signals on receive path 514. The echo approximation EE is compared by comparator 530 with the filtered input signals FB on path 12 of the speech detector. If the magnitude of signals FB do not exceed the magnitude of echo approximation EE, it is assumed that the signals FB represent transmit path echo due to the receive path signals. A corresponding echo indication is provided by comparator 530 on path EC to control circuit 540. At the same time, if the echo is due to speech, the speech detector may provide a speech activity indication on lead 94, and thus to gate 545, in the manner described above. However, the echo indication on path EC causes control circuit 540 to inhibit the passage of the speech activity indication through gate 545, and thus prevent operation of transmit path switch 550.

On the other hand, if a speech activity indication is provided by the speech detector on lead 94 and no echo indication appears on lead EC (i.e., the magnitude of signals FB exceeds that of echo approximation EE), control circuit 540 enables gate 545 to extend the indication therethrough as an operate signal over lead TNS, operating switch 550 to pass the encoded speech signals on transmit path 504 therethrough. The operate signal on lead TNS persists so long as speech activity is indicated via lead 94 concurrently with no echo indication on lead EC. If the speech activity indication on lead 94 ceases at any time, the operate signal on lead TNS terminates substantially immediately, releasing switch 550. If the speech activity indication on lead 94 continues, but an echo indication appears concurrently on lead EC, control circuit 540 may maintain the operate signal on lead TNS, in conventional manner via timer 541, for a predetermined hangover period.

Speech detector activity arising from false operation on echo can be reduced further by varying the hangover provided by speech detector in accordance with the level of the signals on receive path 514. For example, as shown in FIG. 5, if the filtered receive signals FR exceed a certain fixed threshold, echo envelope generator 520 provides a signal on lead TH to the speech detector. Responsive thereto, the speech detector limits the count that may be accumulated in accumulator 40 to a maximun less than the capacity thereof, illustratively a count of 64. This may be implemented quite simply, for example, via respective inhibit gates inserted in series with each of gates 36, 38 and 42 and controlled in obvious manner by the signals on leads TH and 45.

What has been described hereinabove is but illustrative of the principles of our invention. For example, it will be appreciated that applicants' speech detector, though shown and described in connection with a single transmission channel for purposes of describing the invention, may be shared advantageously among a plurality of transmission channels on a time division multiplexed basis, each channel being connected to the speech detector during a distinct timeslot. Numerous and varied other arrangements may be derived by those skilled in the art without departing from the spirit and scope of the invention.

What is claimed is:

1. A speech detector, means for receiving input signal samples, means for generating a representation of the average magnitude of said samples, means for comparing each said sample with said representation and for providing an output signal corresponding to the difference therebetween, and means for accumulating said output signals, said accumulating means generating different control signals corresponding to different predetermined levels of said accumulated output signals.

2. A speech detector according to claim 1 wherein said accumulating means includes input means for weighting said output signals according to the corresponding differences between said samples and said representation.

3. A speech detector according to claim 1 wherein said comparing means includes means for quantizing said differences between said samples and said representation, and wherein said output signals correspond to said quantized differences.

4. A speech detector according to claim 1 wherein said receiving means includes highpass filter means.

5. A speech detector according to claim 1 further comprising output means responsive to a first predetermined one of said control signals for generating a speech activity indication and responsive to a second predetermined one of said control signals for terminating said indication after a fixed interval of time.

6. A speech detector according to claim 3 wherein said accumulating means includes input means for weighting said output signals according to the corresponding differences between said samples and said representation.

7. A speech detector according to claim 6 further comprising means for varying the rate of accumulation of at least one of said output signals in accordance with the peak average magnitude of said samples.

8. A speech detector, means including a highpass filter for receiving encoded input signal samples, averaging means for generating an encoded representation of the average magnitude of the filtered samples over a particular interval of time, comparator means for generating respective output signals corresponding to the quantized difference between each of said filtered samples and said encoded representation, means for accumulating said output signals and for generating different control signals corresponding to said accumulation exceeding different predetermined magnitudes, and output means responsive to a first one of said control signals for providing a speech activity indication.

9. A speech detector according to claim 8 wherein said comparator output signals are weighted according to said quantized differences.

10. A speech detector according to claim 8 further comprising means responsive to a second one of said control signals for storing an encoded representation of the peak average magnitude of said samples.

11. A speech detector according to claim 10 further comprising timing means for generating a sequence of timing signals at a rate determined by said peak average magnitude representation and for extending said timing signals to said accumulating means, said accumulating means including means responsive to said timing signals and to a predetermined output signal generated by said comparator means for decrementing said accumulation.

12. A speech detector according to claim 11 further comprising means responsive to said accumulation falling below a certain magnitude for modifying said peak average magnitude representation.

13. A speech detector according to claim 11 wherein said accumulating means includes means for generating a third control signal corresponding to said accumulation falling below a fixed magnitude.

14. A speech detector according to claim 13 wherein said output means includes means responsive to said third control signal for terminating said speech activity indication after a fixed interval of time.

15. A speech detector, means for receiving input signal samples, means for generating a representation of the exponentially-mapped-past (EMP) average of said input samples, means for providing a first control signal when the magnitude of one of said input samples is less then two times said EMP average, means for providing a second control signal when the magnitude of one of said input samples is greater than four times said EMP average, means for providing a third control signal when the magnitude of one of said input samples is greater than two times said EMP average but is less than four times said EMP average, means for weighting each of said control signals differently, means for accumulating said weighted control signals, and means for providing a first output signal when the accumlation of said weighted control signals exceeds a predetermined threshold magnitude.

16. A speech detector according to claim 15 further comprising echo protection means including means for approximating echo anticipated in said input signal samples, means for providing an echo indication when the magnitude of one of said input signal samples is less than said echo approximation, and means responsive to said echo indication and said first output signal for controlling the transmission of said input signal samples.

17. A speech detector according to claim 16 wherein said controlling means includes means for disabling transmission of said input signal samples in the absence of said first output signal.

* * * * *